(12) United States Patent
Wu

(10) Patent No.: US 9,431,424 B1
(45) Date of Patent: Aug. 30, 2016

(54) METHOD FOR CREATING METAL GATE RESISTOR IN FDSOL AND RESULTING DEVICE

(71) Applicant: GLOBALFOUNDRIES Inc., Grand Cayman (KY)

(72) Inventor: Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/872,294

(22) Filed: Oct. 1, 2015

(51) Int. Cl.
| | |
|---|---|
| H01L 29/00 | (2006.01) |
| H01L 27/12 | (2006.01) |
| H01L 21/84 | (2006.01) |
| H01L 21/762 | (2006.01) |
| H01L 49/02 | (2006.01) |
| H01L 21/28 | (2006.01) |
| H01L 21/311 | (2006.01) |
| H01L 21/283 | (2006.01) |
| H01L 27/06 | (2006.01) |
| H01L 29/423 | (2006.01) |
| H01L 29/06 | (2006.01) |
| H01L 21/306 | (2006.01) |

(52) U.S. Cl.
CPC ......... *H01L 27/1203* (2013.01); *H01L 21/283* (2013.01); *H01L 21/28008* (2013.01); *H01L 21/30604* (2013.01); *H01L 21/31111* (2013.01); *H01L 21/76224* (2013.01); *H01L 21/84* (2013.01); *H01L 27/0629* (2013.01); *H01L 28/20* (2013.01); *H01L 29/0649* (2013.01); *H01L 29/4232* (2013.01)

(58) Field of Classification Search
CPC ................... H01L 27/1203; H01L 21/76224; H01L 21/84
USPC ........................................... 257/508
See application file for complete search history.

(56) References Cited

U.S. PATENT DOCUMENTS

| | | | |
|---|---|---|---|
| 6,730,586 B2 * | 5/2004 | Endoh ............... | H01L 29/66318 257/E21.387 |
| 6,806,517 B2 * | 10/2004 | Kim .................. | H01L 21/28114 257/204 |

* cited by examiner

*Primary Examiner* — Theresa T Doan
(74) *Attorney, Agent, or Firm* — Ditthavong & Steiner, P.C.

(57) ABSTRACT

Fabricating FEOL metal gate resistor structures and the resulting device are disclosed. Embodiments include providing a Si layer-insulator layer-Si substrate stack; forming STI regions at first through fourth sides of a rectangular active-area of the Si layer, the first side opposing the third, the STI extending into the substrate; recessing the STI below the insulator upper surface; undercutting the active-area, forming channels in the insulator along and under perimeter edges of the active-area; conformally forming a high-k dielectric on all exposed surfaces; forming metal on the high-k dielectric and filling the channels; removing the metal except for the filled channels and a portion over each of the STI at the first and third sides and overlapping the active-area; and forming low-k spacers on exposed opposing sidewalls of the metal portions and exposed vertical surfaces of the high-k dielectric on edges of the active-area and the filled channels.

15 Claims, 7 Drawing Sheets

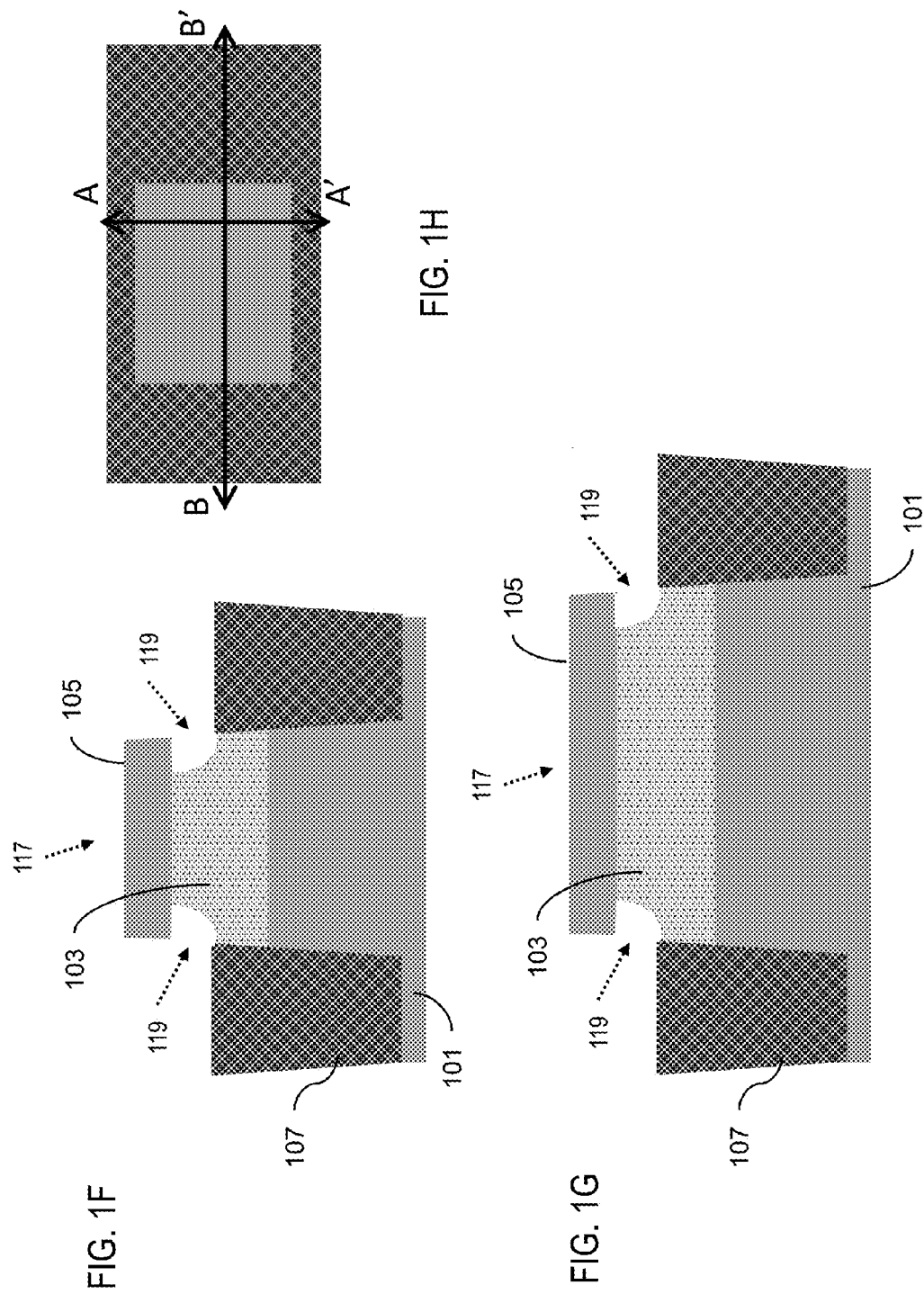

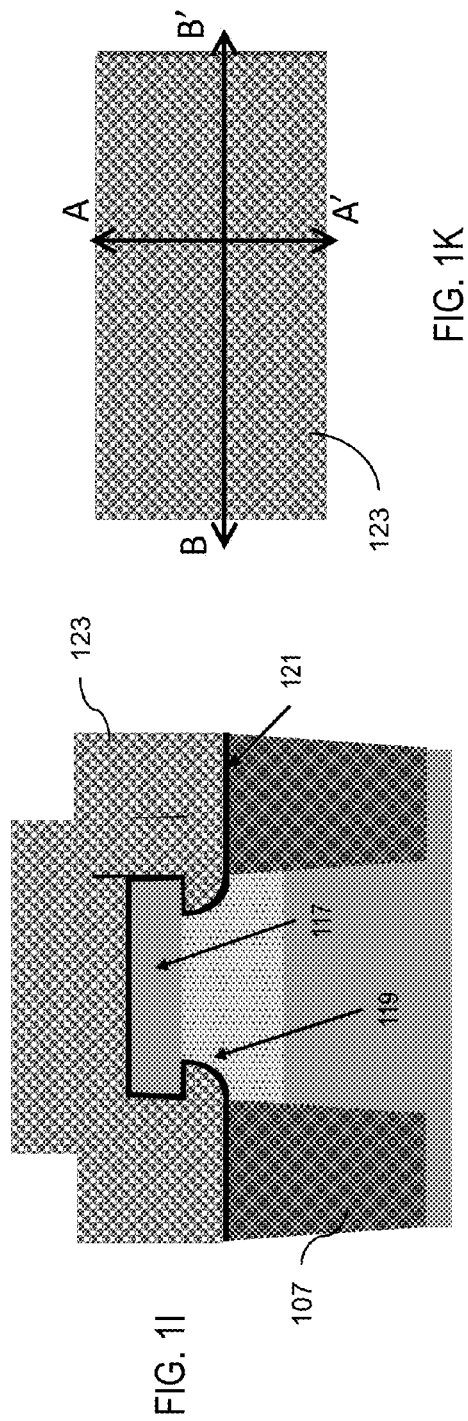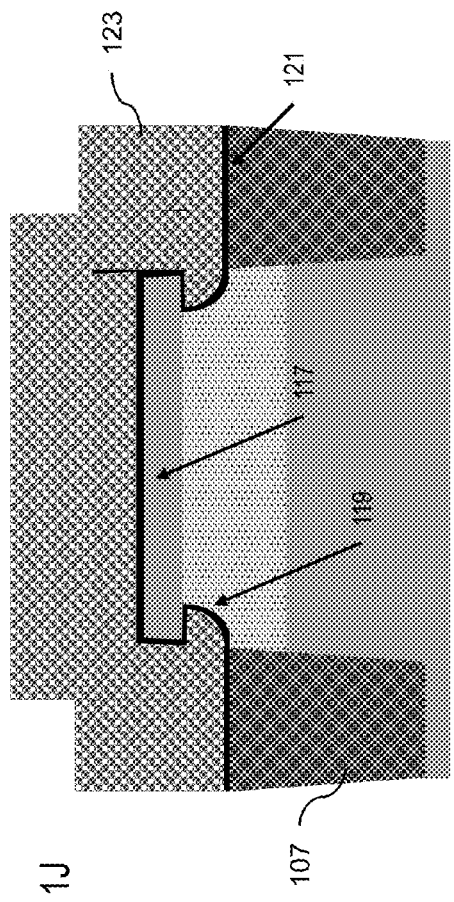
FIG. 1I
FIG. 1J
FIG. 1K

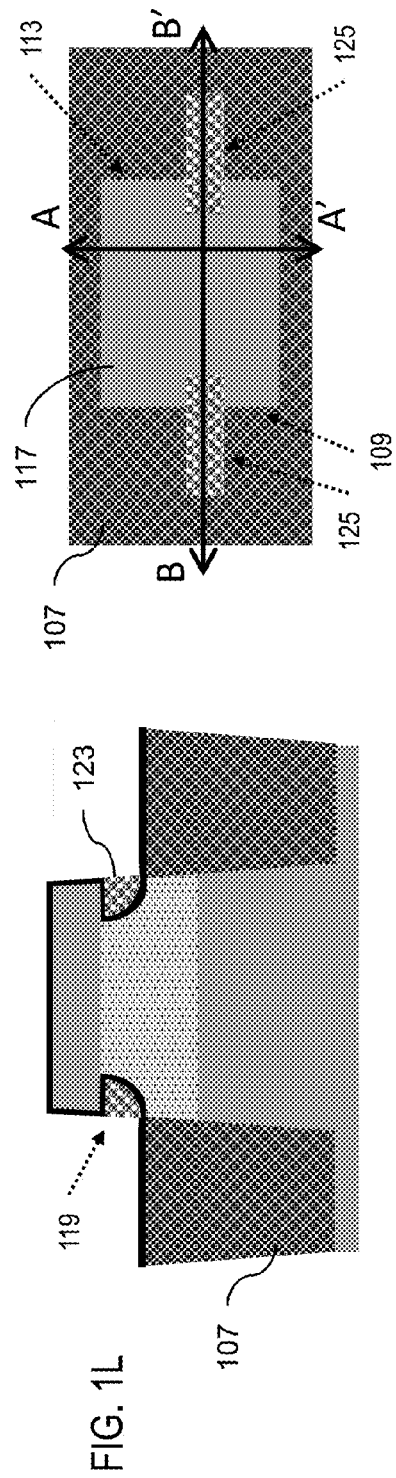
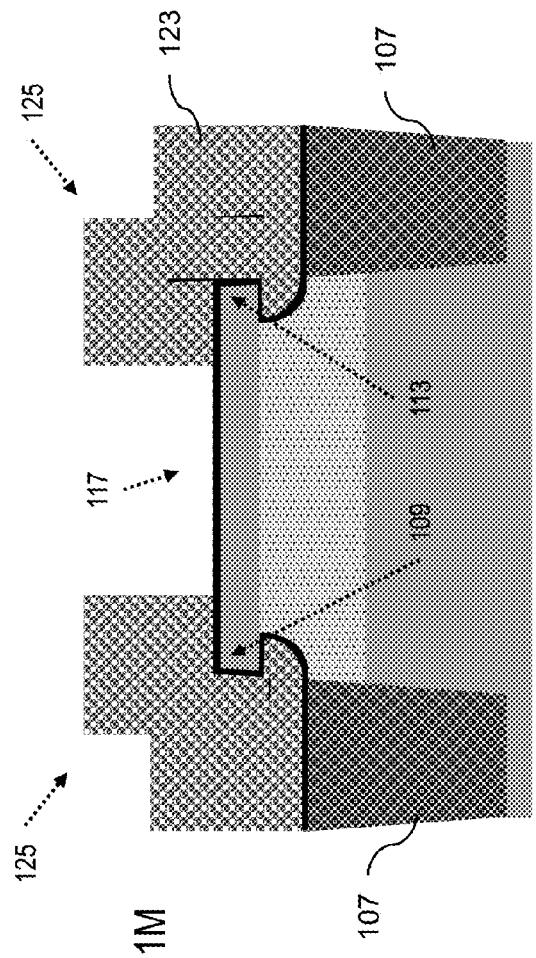
FIG. 1L
FIG. 1M
FIG. 1N

METHOD FOR CREATING METAL GATE RESISTOR IN FDSOL AND RESULTING DEVICE

TECHNICAL FIELD

The present disclosure relates generally to designing and fabricating integrated circuit (IC) devices. The present disclosure is particularly applicable to design and fabrication of IC devices utilizing metal gate based processes and front-end-of-line (FEOL) metal resistors in the 28 nanometer (nm) technology node and beyond.

BACKGROUND

Traditionally, in IC devices based on 28 nm and earlier technology nodes, doped polysilicon may be used for gate material as well as for FEOL gate resistors. In devices using metal gates, such as 22 nm fully depleted silicon on isolator (FDSOI) devices, a middle-of-line (MOL) RM resistor is used as a FEOL resistor; however, additional RM processes and a thicker interlayer dielectric layer in a MOL substrate stack may be necessary causing fabrication complexities. Nevertheless, the MOL resistor is necessary since resistance of the metal gate material (e.g., titanium nitride (TiN), tungsten (W), etc.) may be lower than doped polysilicon and, therefore, unable to provide sufficient resistance as a gate resistor. For controlling the gate resistance through gate patterning, sufficiently thin metal lines may be unachievable due to photolithography process limitations. Also, a height of the gate may be based on a minimum height of a gate fin and metal fill.

A need therefore exists for methodology enabling fabrication of a metal gate resistor structure as a FEOL resistor in devices using metal gate technology.

SUMMARY

An aspect of the present disclosure is a method enabling fabrication of a metal gate resistor structure as a FEOL resistor in devices using metal gate technology.

Another aspect of the present disclosure is a device based on a metal gate technology including a metal gate resistor structure as a FEOL resistor.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing an insulator layer on an upper surface of a Si substrate, and a Si layer on an upper surface of the insulator layer; forming shallow trench isolation (STI) regions at first, second, third, and fourth sides of a rectangular active area of the Si layer, the first side opposing the third, wherein the STI regions extend vertically from an upper surface of the Si layer and into the Si substrate; recessing the STI regions below the upper surface of the insulator layer; undercutting the active area of the Si layer, forming channels in the insulator layer along and under perimeter edges of the active area; conformally forming a high-k dielectric layer on all exposed surfaces; forming a metal layer on the high-k dielectric layer and filling the channels; removing the metal layer except for the filled channels and a portion over each of the STI regions at the first and third sides and overlapping the active area; and forming low-k spacers on exposed opposing sidewalls of the metal portions overlapping the active area, exposed vertical surfaces of the high-k dielectric layer on edges of the active area, and exposed surface of the filled channels.

Other aspects include forming the high-k dielectric layer and metal layer concurrently with forming a high-k/metal gate. Further aspects include forming resistor contacts on upper surfaces of remaining metal portions; and forming an interlayer dielectric covering sides of the resistor contacts, metal portions, and the low-k spacers. Additional aspects include forming the resistor contacts concurrently with gate contacts. Another aspect includes forming the channels by an isotropic etching process. Further aspects include removing the metal layer by an anisotropic etching process. In one aspect, metal layer in the channels forms a metal resistor line conducting an electrical current between the metal portions over the first and third STI regions. Another aspect includes determining a width, a height, or a combination thereof for the channels based, at least in part, on a target resistance for the metal resistor line. Other aspects include determining a width, a height, and/or lengths of the channels based, at least in part, on characteristics of the metal layer and a target resistance for the metal resistor line. Additional aspects include recessing the STI regions subsequent to forming the channels. Another aspect includes recessing the STI regions by a dry or wet etching process.

Another aspect of the present disclosure is a device including: a SOI stack including a Si substrate, an insulator layer on an upper surface of the Si substrate, and a Si layer on an upper surface of the insulator layer; STI in the SOI stack at first, second, third, and fourth sides of a rectangular active area of the Si layer, the first side opposing the third, wherein the STI regions extend vertically from below the upper surface of the insulator layer and into the Si substrate; channels in the insulator layer along and under perimeter edges of the active area; a high-k dielectric layer on exposed surfaces of the active area, the STI regions, and in the channels; metal layer filling the channels and a metal portion over each of the STI regions at the first and third sides and overlapping the active area; and low-k spacers on exposed opposing sidewalls of the metal portions overlapping the active area, exposed vertical surfaces of the high-k dielectric layer on edges of the active area, and exposed surface of the filled channels.

Aspects include resistor contacts on upper surfaces of remaining metal portions; and an interlayer dielectric covering sides of the resistor contacts, metal portions, and the low-k spacers. In one aspect, the metal layer in the channels forms a metal resistor line conducting an electrical current between the metal portions over the first and third STI regions. In another aspect, a width, a height, or a combination thereof of the channels is based, at least in part, on a target resistance for the metal resistor line. In a further aspect, a width, a height, and/or lengths of the channels is based, at least in part, on characteristics of the metal layer and a target resistance for the metal resistor line.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of extra process steps and a step height difference in the MOL stack attendant upon fabricating a metal gate resistor for SOI technology with a metal gate process. According to the present disclosure, the metal gate line size width and height may be much smaller than current photolithography patterning limitations and still meet the resistor specifications. The proposed method may be more efficient than the current method for a MOL RM resistor solution without requiring an additional mask step.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
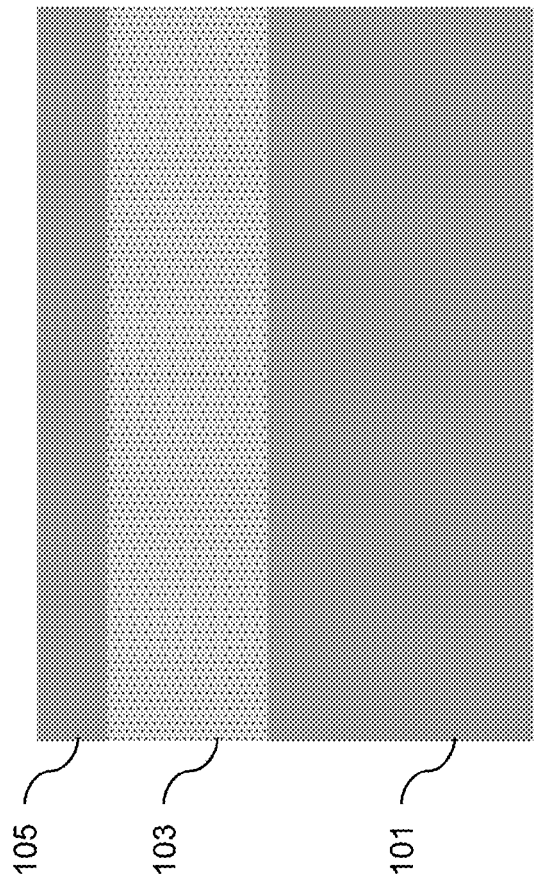
FIGS. 1A through 1R schematically illustrate a process flow for fabricating a metal gate resistor in devices utilizing a metal gate based process, in accordance with exemplary embodiments.
Figure 1B:
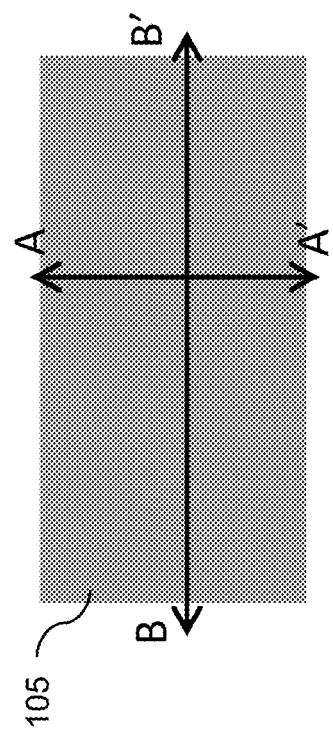

FIG. 1A illustrates a SOI stack including a Si substrate 101, an insulator layer 103 on an upper surface of the Si substrate 101, and a Si layer 105 on an upper surface of the insulator layer 103. FIG. 1B illustrates a top view of Si layer 105 of the SOI stack, where cross sectional lines A-A' (view-A) and B-B' (view-B) may be referenced when discussing other cross sectional views in figures below.

Figure 1C:
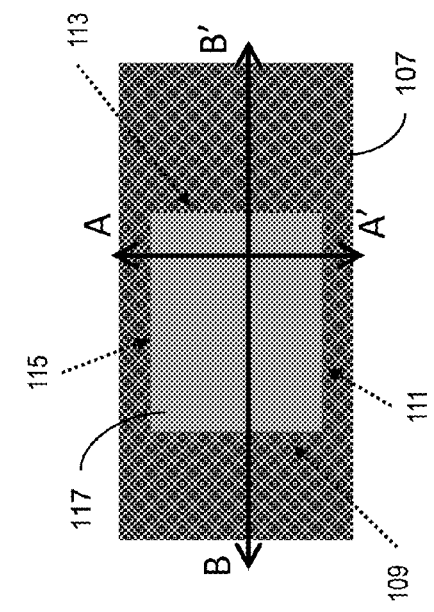
Figure 1D:
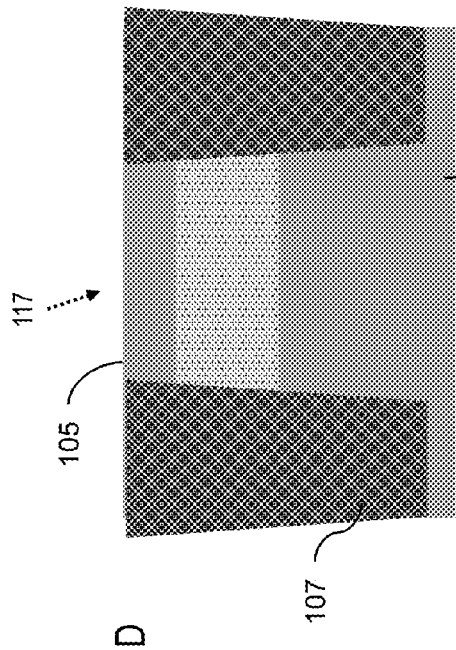
Figure 1E:
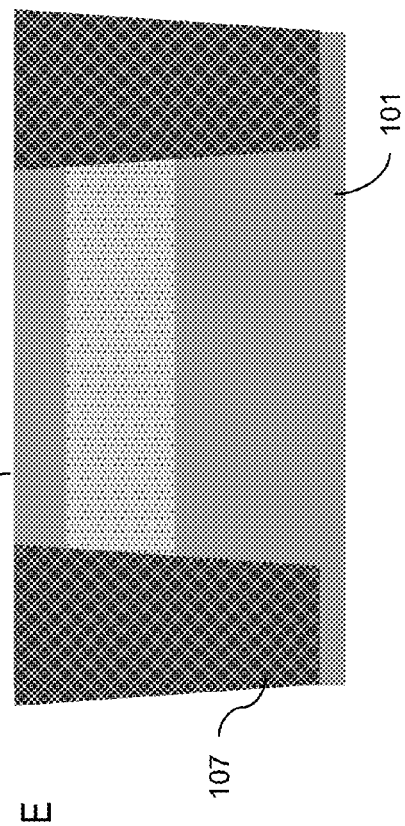
Figure 1Q:
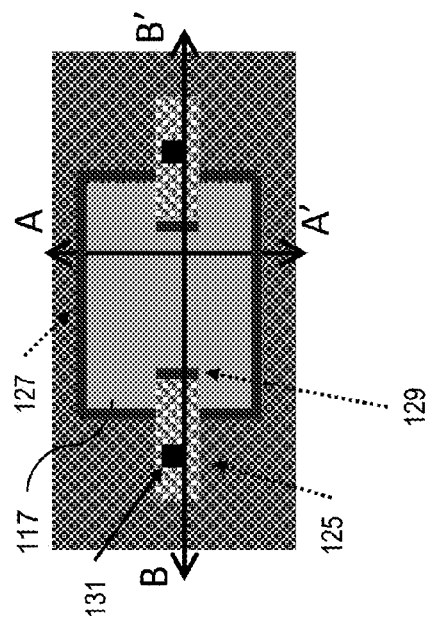

Adverting to FIG. 1C, view-A illustrates formation of STI regions 107 into the SOI stack at first 109, second 111, third 113, and fourth 115 sides of an active area 117 of the Si layer 105. The first side 109 opposes the third side 113 and the second side 111 opposes the fourth side 115. As illustrated in FIGS. 1D, view-A, and 1E, view-B, the STI regions 107 extend vertically from an upper surface of the Si layer 105 and into the Si substrate 101 on four sides of the active area 117.

Adverting to FIGS. 1F and 1G, view-A and view-B, respectively, illustrate a recessing (e.g., by a dry or wet etching process) of the STI regions 107 below the upper surface of the insulator layer 103 (e.g., to between the Si substrate 101 and the Si layer 105). Additionally illustrated is an undercutting, for example, by an isotropic etching process, of the active area 117 of the Si layer 105 to form channels 119 in the insulator layer 103 along and under perimeter edges of the active area 117. The STI regions 107 are recessed subsequent to forming the channels 119. The channel will ultimately hold a metal resistor line. A width, a height, or a combination thereof for the channels is determined based, at least in part, on a target resistance for the metal resistor line. Alternatively, the width, the height, and/or lengths of the channels may be based, at least in part, on characteristics of the metal layer and a target resistance for the metal resistor line. Changes to the SOI stack described in FIGS. 1F and 1G may not be necessarily visible in the top view presented in FIG. 1H.

As illustrated in FIGS. 1I and 1J, view-A and view-B, respectively, a high-k dielectric layer 121 may be conformally formed on exposed surfaces of the active area 117, the STI regions 107, and in the channels 119. Additionally, a metal layer 123 is deposited on the high-k dielectric layer 121 and filling the channels 119. The high-k dielectric layer and metal layer are formed as part of a standard high-k/metal gate deposition process, concurrently with a high-k/metal gate. FIG. 1K illustrates a top view of the metal layer 123 already formed on the high-k dielectric layer 121 (not shown for illustration convenience).

Adverting to FIG. 1L, view-A illustrates that the metal layer 123 may be removed except for the filled channels 119. FIG. 1M illustrates view-B where a portion 125 of the metal layer also remains over each of the STI regions 107 at the first side 109 and the third 113 side and overlapping the active area 117. The metal layer may be removed by an anisotropic etching process, which forms vertical sidewalls. The metal layer 123 in the channels 119 forms a metal resistor line conducting an electrical current between the metal portions over the first 109 and third 113 STI regions. FIG. 1N illustrates a top view of the changes described in FIGS. 1L and 1M.

Figure 1O:
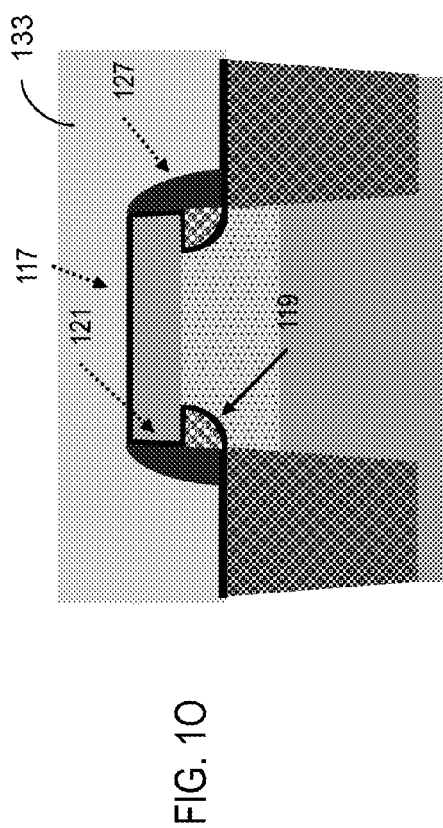
Figure 1P:
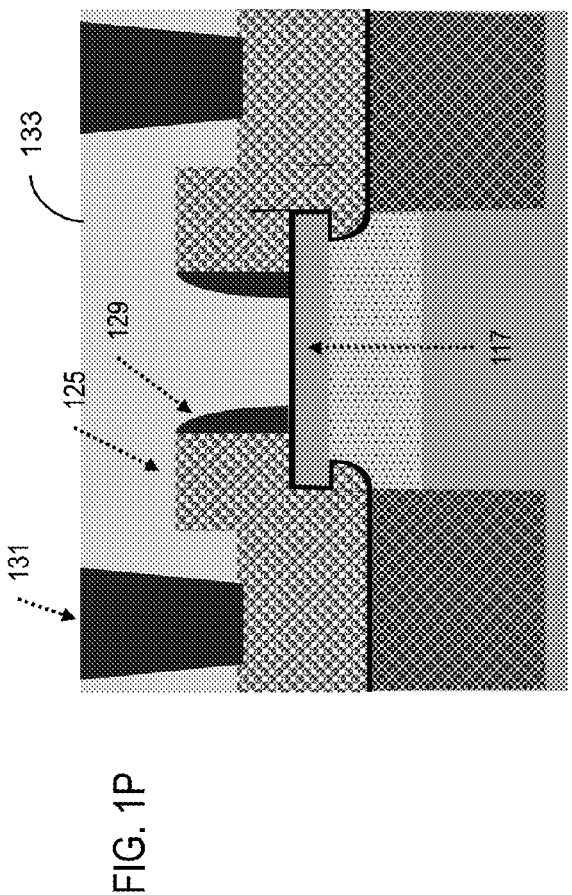

FIG. 1O illustrates view-A where low-k spacers 127 are formed on exposed vertical surfaces of the high-k dielectric layer 121 on edges of the active area 117, and exposed surface of the filled channels 119. FIG. 1P illustrates view-B where the low-k spacers 129 are formed on exposed opposing sidewalls of the metal portions 125 and overlapping the active area 117. Also illustrated in FIG. 1P, resistor contacts 131 are formed on upper surfaces of remaining metal portions 125. As illustrated in FIGS. 1O and 1P, an interlayer dielectric 133 may be formed covering sides of the resistor contacts 131, metal portions 125, and the low-k spacers 127 and 129. The resistor contacts 131 are concurrently formed with gate contacts.

Figure 1R:
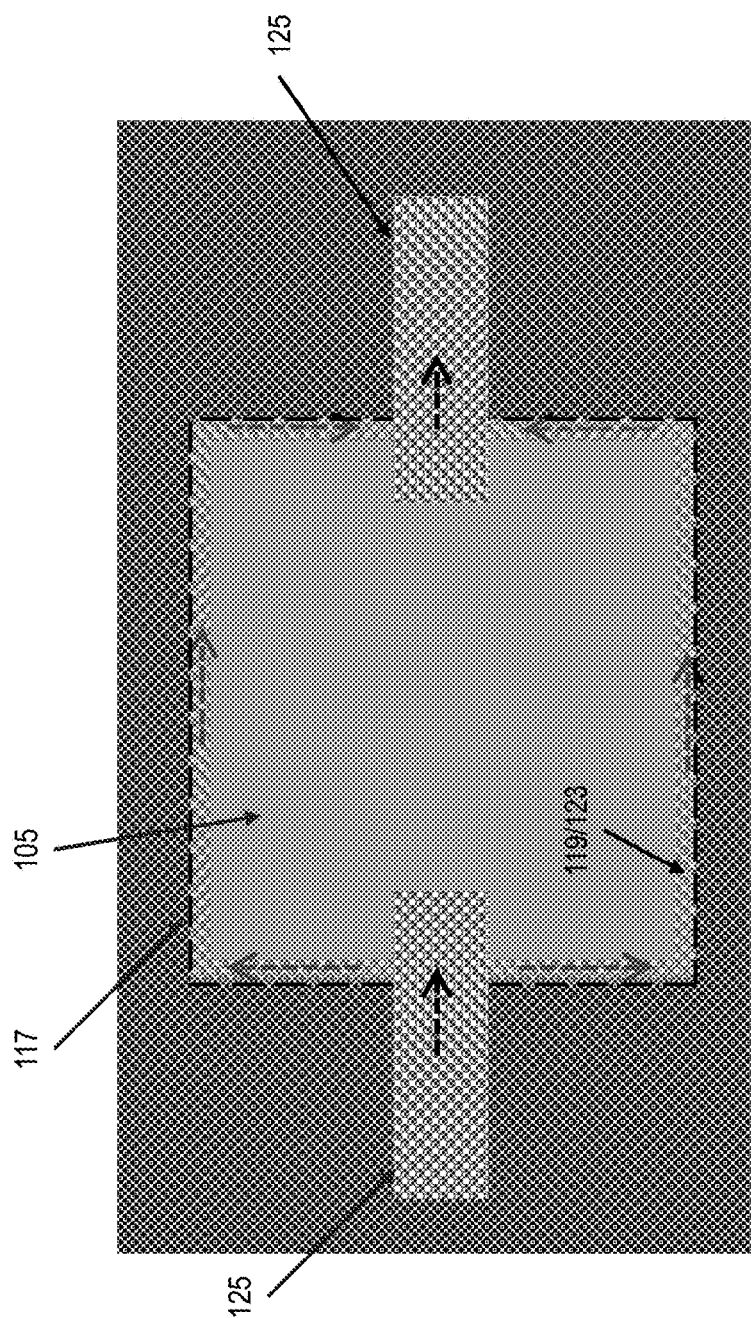

FIG. 1R illustrates a top view including the active region 117 of the Si layer 105 and the channels 119 under perimeter edges (illustrated as dashed lines) of the active region 117, wherein the metal layer 123 in the channels 119 form a resistor for conducting electrical current between the metal portions 125.

The embodiments of the present disclosure can achieve several technical effects including forming a metal gate resistor for SOI technology with metal gate process without requiring additional mask steps. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices requiring a FEOL metal resistor, particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing an insulator layer on an upper surface of a Si substrate and a Si layer on an upper surface of the insulator layer;
   forming shallow trench isolation (STI) regions at first through fourth sides of a rectangular active area of the Si layer, the first side opposing the third, wherein the STI regions extend vertically into the Si substrate;
   recessing the STI regions below the upper surface of the insulator layer;
   undercutting the active area of the Si layer, forming channels in the insulator layer along and under perimeter edges of the active area;
   conformally forming a high-k dielectric layer on all exposed surfaces;
   forming a metal layer on the high-k dielectric layer and filling the channels;
   removing the metal layer except for the filled channels and a portion over each of the STI regions at the first and third sides and overlapping the active area; and
   forming low-k spacers on exposed opposing sidewalls of the metal portions overlapping the active area, exposed vertical surfaces of the high-k dielectric layer on edges of the active area, and exposed surface of the filled channels.

2. The method according to claim 1, comprising:
   forming the high-k dielectric layer and metal layer concurrently with forming a high-k/metal gate.

3. The method according to claim 2, further comprising:
   forming resistor contacts on upper surfaces of remaining metal portions; and
   forming an interlayer dielectric covering sides of the resistor contacts, metal portions, and the low-k spacers.

4. The method according to claim 3, comprising:
   forming the resistor contacts concurrently with gate contacts.

5. The method according to claim 2, comprising forming the channels by an isotropic etching process.

6. The method according to claim 2, comprising removing the metal layer by an anisotropic etching process.

7. The method according to claim 2, wherein the metal layer in the channels forms a metal resistor line conducting an electrical current between the metal portions over the first and third STI regions.

8. The method according to claim 7, comprising determining a width, a height, or a combination thereof for the channels based, at least in part, on a target resistance for the metal resistor line.

9. The method according to claim 7, comprising determining a width, a height, and/or lengths of the channels based, at least in part, on characteristics of the metal layer and a target resistance for the metal resistor line.

10. The method according to claim 2, comprising recessing the STI regions subsequent to forming the channels.

11. The method according to claim 2, comprising recessing the STI regions by a dry or wet etching process.

12. A method comprising:
    providing a silicon on insulator (SOI) stack including a silicon (Si) substrate, an insulator layer on an upper surface of the Si substrate, and a Si layer on an upper surface of the insulator layer;
    forming shallow trench isolation (STI) regions in the SOI stack at first, second, third, and fourth sides of a rectangular active area of the Si layer, the first side opposing the third and the second side opposing the fourth, wherein the STI regions extend vertically from an upper surface of the Si layer and into the Si substrate;
    recessing the STI regions, by a dry or wet etching process, below the upper surface of the insulator layer;
    undercutting the active area of the Si layer by an isotropic etching process, forming channels in the insulator layer along and under perimeter edges of the active area;
    conformally forming a high-k dielectric layer on all exposed surfaces;
    forming a metal layer on the high-k dielectric layer and filling the channels;
    removing the metal layer, by an anisotropic etching process, except for the filled channels and a portion over each of the STI regions at the first and third sides and overlapping the active area; and
    forming low-k spacers on exposed opposing sidewalls of the metal portions overlapping the active area, exposed vertical surfaces of the high-k dielectric layer on edges of the active area, and exposed surface of the filled channels.

13. The method according to claim 12, further comprising:
    forming resistor contacts, concurrently with gate contacts, on upper surfaces of remaining metal portions; and
    forming an interlayer dielectric covering sides of the resistor contacts, metal portions, and the low-k spacers.

14. The method according to claim 12, wherein the metal layer in the channels forms a metal resistor line conducting an electrical current between the metal portions over the first and third STI regions.

15. The method according to claim 14, comprising determining a width, a height, and/or lengths for the channels based, at least in part, on characteristics of the metal layer, a target resistance for the metal resistor line, or a combination thereof.

* * * * *